United States Patent [19]

Klaser

[11] Patent Number: 4,870,746
[45] Date of Patent: Oct. 3, 1989

[54] METHOD OF MAKING A MULTILAYER PRINTED CIRCUIT BOARD HAVING SCREENED-ON RESISTORS

[75] Inventor: John J. Klaser, Springfield, Mo.

[73] Assignee: Litton Systems, Inc., Springfield, Mo.

[21] Appl. No.: 268,306

[22] Filed: Nov. 7, 1988

[51] Int. Cl.[4] ............................................. B23P 19/00
[52] U.S. Cl. .......................................... 29/620; 29/830
[58] Field of Search .................. 29/610.1, 620, 829, 29/830, 846; 338/258

[56] References Cited

U.S. PATENT DOCUMENTS

| | | |
|---|---|---|
| 3,648,364 | 3/1972 | Endo . |
| 3,775,725 | 11/1973 | Endo . |
| 4,180,608 | 12/1979 | Del . |
| 4,267,634 | 5/1981 | Wellard . |
| 4,424,251 | 1/1984 | Sugishita et al. . |
| 4,486,738 | 12/1984 | Sadlo et al. ........................ 29/620 X |
| 4,554,732 | 11/1985 | Sadlo et al. ............................ 29/620 |
| 4,574,255 | 3/1986 | Fujii et al. . |

OTHER PUBLICATIONS

Carlisle, Ben H., "Screen Printing Promises Smaller, Cheaper PCBs", Machine Design, Dec. 11, 1986, pp. 5 101-104.

*Primary Examiner*—Timothy V. Eley
*Attorney, Agent, or Firm*—Michael H. Wallach; Robert F. Rotella

[57] ABSTRACT

A method is disclosed for manufacturing multilayer printed circuit boards in which one or more layers thereof, including intermediate layers, may include one or more screened on resistors. The method is particularly well suited for use where large numbers of resistors are required on one or more intermediate layers of a multilayer printed circuit board. The method includes the steps of manufacturing individual layers of the multilayer board with electrical circuits thereon and subsequently screening on one or more values of resistors using a polymer thick film resistive ink. Each layer of the multilayer board is cured to dry the polymer thick film resistors. The individual layers are thereafter bonded together into a multilayer board.

20 Claims, 4 Drawing Sheets

METHOD OF MAKING A MULTILAYER PRINTED CIRCUIT BOARD HAVING SCREENED-ON RESISTORS

BACKGROUND OF THE INVENTION

1. Field of the Invention

This invention relates to printed circuit boards in general, and in particular to multilayer printed circuit boards which have resistors printed on one or more of the board's intermediate layers.

2. Summary of the Prior Art

The density of components and conductor circuits placed on printed circuit boards has been increasing in response to the need to accommodate increasingly complex electronic circuitry in smaller spaces. In addition to accommodating a greater number of conductor paths than heretofore, many printed circuit boards being manufactured today have a greater number of discrete components mounted thereon. Frequently, electronic circuits contained on printed circuit boards require a very large number of resistors to perform various functions, for example, terminating circuits, current limiters or digital attenuators. One method used to increase the density of conductor paths on printed circuit boards has been through the use of multilayer boards in which multiple layers, each containing etched copper circuitry, are sandwiched together. In addition to the method in which individual printed circuit layers are separately fabricated using, for example, a photolithographic process, and then laminated together, there have been uses of thin, screened-on insulating layers between multiple conductor planes to increase the density of conductors on a circuit board. Such an arrangement is described in an article by B. M. Carlisle appearing in the Dec. 11, 1986 issue of *Machine Design* at pages 101–105. The foregoing article describes the use of polymer thick film (PTF) conductive inks which contain a silver conductive material to produce circuit paths on printed circuit boards by screening the PTF conductors over an insulating layer screened on top of conventionally manufactured etched copper conductors. The article also describes the use of PTF resistive material for producing resistors which may be screened onto the surface of a circuit board. As noted in the foregoing article, however, components which must be connected to the circuits on the board must be mounted on the circuit board's surface and connected to the underlying circuit by means of holes passing from the surface of the circuit board to the plane containing the circuit's conductors. Thus, while the foregoing arrangement may be suitable for providing one or more additional layers of conductor paths, it does not provide any additional space to mount arrays of resistors, especially a large number of resistors, which might be required as integral elements of the circuit's deposited on the printed circuit board. Such resistors must be mounted essentially only on the top layer of the board.

As noted above, in many applications it is desirable to terminate circuits with resistive loads. Heretofore, in most instances such terminations were required to be made by mounting resistors on the surface of a circuit board and connecting the resistors to conductors through holes which passed from the board's surface through one or more conductor planes to the conductor paths to which the resistors are to be connected. Resistors used to accomplish such terminating function could be either conventional carbon composition resistors or resistors screened onto the circuit board's top surface using PTF resistive ink. In the event that surface mounting of the resistors is not suitable, e.g. where resistive terminations are required in a board having many layers and limited surface area, the circuit designer could use a material sold under the name "Ohmega-Ply" by Ohmega Technologies, Inc., Culver City, Calif. The Ohmega-Ply material is composed of a layer of resistive material sandwiched between upper copper conductive layers and lower core material (FR-4 or Polyimide). The Ohmega-Ply material may be used to make resistor-conductor networks using a photolithographic process. See, for example, U.S. Pat. No. 3,691,007 which issued Sept. 12, 1972 and U.S. Pat. No. 3,808,576 which issued Apr. 30, 1974 which provide details of the construction and use of Ohmega-Ply brand materials. The Ohmega-Ply material may be etched using conventional etching processes to produce circuit layers having integral discrete resistors. However, one problem with Ohmega-Ply material which makes it undesirable for use in multilayer printed circuit boards is that it is difficult to produce resistors for a layer whose values substantially differ from each other within the layer e.g., vary by more than one decade. Still another problem is that resistors manufactured from Ohmega-Ply material are not suitable to having their resistance values quickly adjusted by trimming with a laser trimmer because of a tendency of the Ohmega-Ply material to crack due to heating from the laser beam.

U.S. Pat. No. 4,424,251 which issued Jan. 3, 1984 describes a method for manufacturing a thick film multilayer wiring board having thick film resistors in the inner layer. The process described permits the use of thick film resistors manufactured with a binder glass without the binder reacting with a hard glass insulation layer used to cover the conductors on the board. However, as noted in the foregoing patent, an insulating layer comprised of a crystallized glass must be applied over the thick film resistors to prevent reaction between the binder glass in the thick film resistors and the hard glass insulation layer during baking of the hard glass insulation layer. Neither the alumina (ceramic) substrate material, the cermet resistor material, or the hard glass insulation layer are usable in the manufacture of laminated multilayer circuit boards.

SUMMARY OF THE INVENTION

A principal object of this invention is to provide a method for manufacturing multilayer printed circuit boards using conventional multilayer core materials having resistor elements on one or more intermediate layers of the multilayer printed circuit board.

A further object is to provide a method for producing a multilayer printed circuit board in which resistor elements may be efficiently printed on at least one of the intermediate layers of the printed circuit board using a screen printing process.

Still another object is to provide a method for producing a multilayer printed circuit board in which multiple resistor elements contained on intermediate layers of the printed circuit board may vary by more than one decade in resistance value from other resistor elements contained on the same layer.

Another object is to provide a method for producing a multilayer printed circuit board in which the value of resistor elements printed on at least one of the intermediate layers of the printed circuit board may be adjusted after printing.

The above and other objects and advantages are achieved by using a screening process to apply one or more series of resistors onto one or more layers of a multilayer printed circuit board prior to bonding the layers together to form the multilayer board. The resistors are produced from a polymer thick film (PTF) resistive paste which may be screened onto the surface of a printed circuit. PTF pastes having different resistivities may be blended with each other prior to screening onto the printed circuit board to achieve specific sheet resistivities. Specific resistance values for each of the resistors screened on each layer may be achieved by varying the dimensions of the area covered by each resistor. Resistors having substantially different resistance values, e.g. resistance values one or more decade different from each other, may be placed on the same layer of a multilayer printed circuit board by performing successive screenings of the board using resistance inks with different sheet resistivities. A pattern of circuit paths for electrically connecting the resistors is formed on the surface of one or more layers of the multilayer printed circuit board using any conventional technique well known in the art. For example, the circuit paths may be prepared from a copper clad substrate using a photolithographic process in which the desired conductor paths are photolithographically reproduced on the printed circuit board from a photomask. Areas are provided between adjacent conductors which are to be connected by screened on resistors. The size and shape of the area between the conductors and the resistivity of the material screened into the area determines the resistance of the resistor deposited therein. Each layer of the multilayer board is baked in an oven after completion of the screening process to completely dry the PTF resistive material. The resistance of each resistor on each layer may then be measured, for example by the use of an automated testing apparatus and, if desired, a laser trimming technique may be used to increase the resistance of any resistors which are not in conformity with specifications. The individual layers of the multilayer board may thereafter be bonded to each other in any conventional, known manner, for example by the use of B-stage thermosetting resin for bonding FR-4 epoxy multilayer boards.

BRIEF DESCRIPTION OF THE DRAWINGS

The foregoing and other objects and advantages of the invention may be more readily understood from an examination of the detailed description of a preferred embodiment when read in conjunction with the accompanying drawings in which.

DETAILED DESCRIPTION OF A PREFERRED EMBODIMENT

Figure 1:
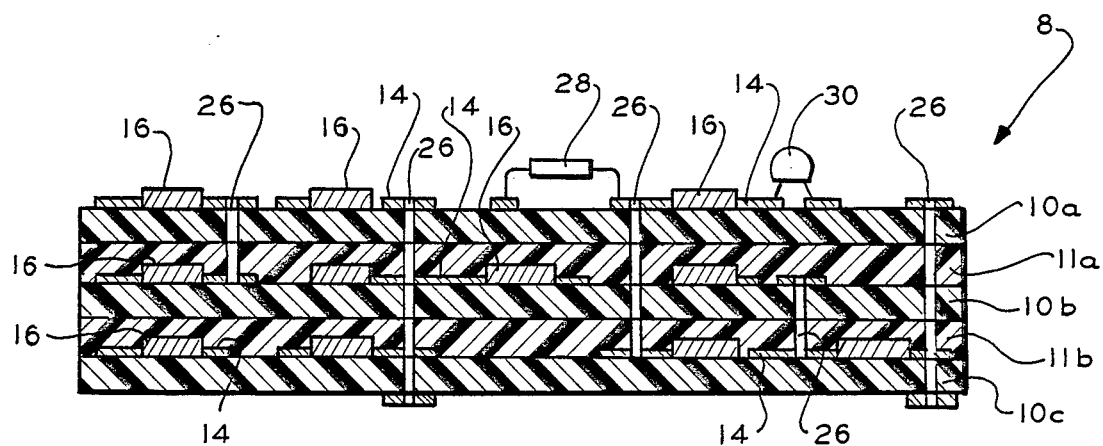
FIG. 1 is a side view of a multilayer printed circuit board having resistor elements on intermediate layers which have been manufactured using the method of this invention.
Figure 2:
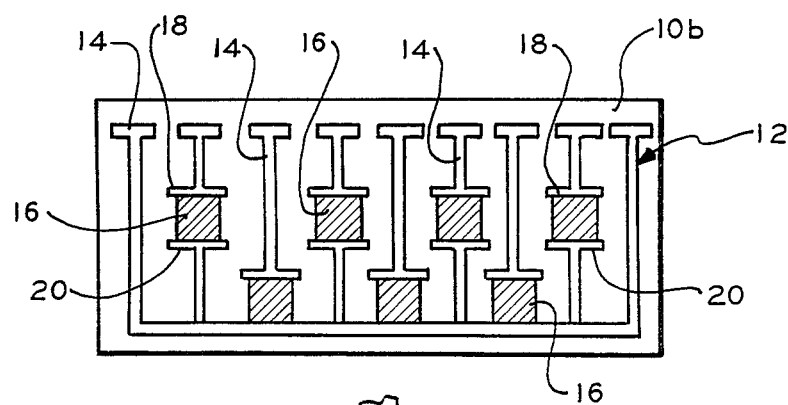
FIG. 2 is a top plan view of one layer of a multilayer printed circuit board having resistor elements contained thereon which have been produced using the method of this invention.

Referring to the drawing, FIG. 1 shows a three layer multilayer printed circuit board 8 comprised of three printed circuit boards 10a, 10b and 10c. The layer 10a, 10b and 10c may be manufactured from any material used for multilayer printed circuit boards, for example an epoxy resin impregnated glass fiber matrix commonly referred to as FR-4 or a polyimide resin material. The three boards 10a, 10b and 10c are bonded to each other by intermediate layers 11a and 11b in any well known manner, for example by the use of a B-stage thermosetting resin. As shown in FIG. 2, each layer 10a, 10b and 10c, for example layer 10b, may contain one or more electrical circuits 12 having a pattern of electrical conductors 14 formed on one side of the layer 10b using any suitable method known in the art. For example, the electrical conductors 14 may be produced using a photolithographic process in which undesired portions of a layer of copper bonded to the layer 10b are selectively etched away in an acid etch bath after the copper layer has been coated with a photoresist such as Dynachem brand photolaminar, exposed to a source of ultraviolet light through a photomask containing the desired pattern of electrical conductors, and then developed using, for example, a potassium carbonate solution. Preferably the material used to produce the electrical conductors is a layer of copper having a preferred thickness of less than 2.8 mils (2 oz) and an optimum thickness of 0.7 mils (½ oz).

A pattern of one or more resistors, for example the series of resistors 16 shown in FIG. 2, may be screened onto one or more layers of a multilayer printed circuit board, for example the three layer board shown in FIG. 1, using the method set forth herein. After producing one or more circuits, for example the circuit 12 shown on layer 10b in FIG. 1, the board is chemically cleaned in preparation for the screening of the resistors thereon. A preferable method of cleaning involves spraying a mild acid micro etch, for example sodium persulfate, onto the surface of the board and then passing the board through a stream of warm forced air to dry the board. The resistors 16 placed on each layer are manufactured from a resistive paste having a known sheet resistivity. For example, the resistive paste sold by Minico/Asahi America (Congers, N.Y.) and referred to as the M-1000-RS Polymer Thick Film (PTF) Resistor System may be used. The foregoing material may be applied to a printed circuit board using a screening process using, for example, a PRESCO Model CP-8115 screen printer to apply the paste. The paste is forced through a 200 mesh stainless steel screen having a pattern embossed thereon corresponding to the pattern of resistors to be screened on the layer. After screening, the layer is thereafter dried by passing the board through an oven, for example a Radiant Technology Corp. Model SMD-6024 six zone IR furnace. To minimize oxidizing of the PTF material, it is preferable to dry each layer in a nitrogen atmosphere.

Figure 3:
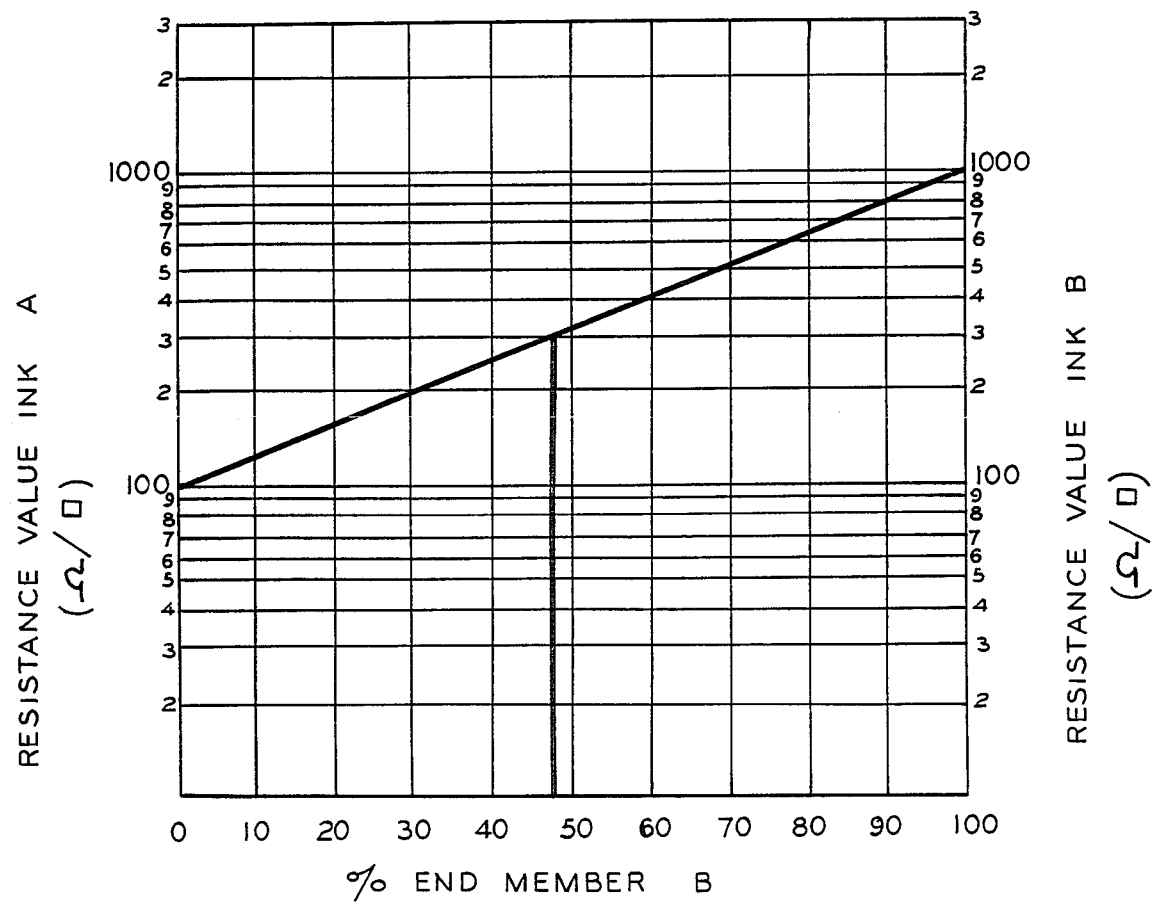
FIG. 3 is a graph which may be used to calculate the mixture ratio for resistive pastes of different resistivities to yield a desired intermediate resistivity.

The resistive paste is available in different resistivities which can be blended to yield resistors having specific resistance values. For example, if resistors having a nominal resistance of 300 ohms are desired, resistive pastes with resistivities of 100 ohms/square and 1000 ohms/square may be blended in a proportional mix using the logarithmic graph shown in FIG. 3. The sheet resistivity of one of the pastes to be blended is located on the left or "A" axis and the sheet resistivity of the other paste is located on the right or "B" axis. A line is drawn connecting the points on the two axes and a horizontal line is thereafter drawn between the desired resistance value (e.g. 300 ohms) on the left axis and the line connecting the values of the sheet resistivities to be blended. The bottom (horizontal) axis of the graph is evenly divided into increments whose total is 100%. A vertical line is drawn from the point of intersection of the first two lines to the horizontal axis. The intercept point of the last line with the horizontal axis shows the percentage by weight of each paste to be mixed to produce the desired resistance value. For the example in which it is desired to produce resistors having a resistance of 300 ohms, 48 percent of the mix to be blended should be paste of one thousand ohm sheet resistivity and 52 percent should be paste of one hundred ohm sheet resistivity. Alternatively, the percentages of each of two inks to be blended to yield the desired resistivity may be calculated from the formula:

$$\text{Percentage of paste } B \text{ required} = \frac{[\log(X) - \log(A)]}{[\log(B) - \log(A)]}$$

Where:
X = desired resistance value
A = sheet resistivity of lower value paste
B = sheet resistivity of higher value paste The resistance values of resistors is determined by the sheet resistivity of the paste used to print the resistor and the aspect ration (length/width) of the printed resistor. For example, it has been found that resistors having a nominal resistance of 200 ohms may be produced by screening PTF paste having a sheet resistivity of 100 ohms/square into an area 200 mils long by 100 mils wide. Factors which may affect the final value of the resistors include print thickness and degree of cure.

Resistors having resistance values which differ from each other within a limited range, i.e. resistance values separated by approximately less than one decade difference, may be printed with one screening operation on a common layer, for example layer 10b, by using paste of the same sheet resistivity and by varying the aspect ratio, i.e. the length and width dimensions, of each resistor printed on the layer. Resistors outside the one decade range may still be printed on a common layer by using additional printing operations.

Figure 4:
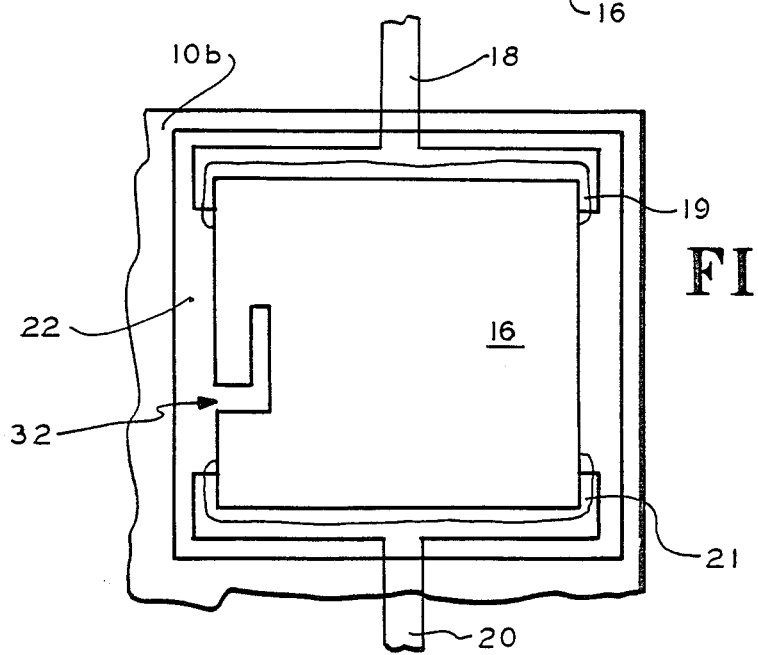
FIG. 4 is a top plan view of a portion of a layer of a multilayer printed circuit board showing the details of a resistor element manufactured in accordance with the teachings of this invention.

As noted in FIG. 4, the PTF paste is screened between conductors, for example the conductors 18 and 20. Conductors 18 and 20 may be copper circuit paths or any other electrical conductor which may be used in conjunction with a printed circuit board. Thus it is conceivable that the circuit 12 could be composed in whole or in part by screening electrically conductive material onto the layer 10b, for example a model M-4000 silver conductive paste sold by Minico/Asahi Chemical Company of America. When copper conductors are used, especially when the conductors are approximately 1.4 mils or more thick, it has been found beneficial to screen print thin layers of silver ink 19, 21 over each edge of the conductors 18 and 20 prior to screening the resistive paste onto the surface of each layer. The silver ink decreases that contact resistance between the conductors 18, 20 and the resistor and reduces the effect of oxidation of the underlying copper. The silver ink also eliminates the tendency of the resistor to crack at the junction between the resistive paste and the thick copper termination. Cracking at this junction will create partial and/or complete open circuits of the resistors, which will cause them to be unusable. In some instances, especially when the completed printed circuit board may be subject to high ambient humidity, it may prove advantageous to coat each resistor with a dielectric layer 22 after the resistors 16 have been screened and cured. A suitable dielectric for such applications is sold by Minico/Asahi Chemical Co., of America under its Model 7000 designation.

FIG. 4 also shows how each resistor 16 may be trimmed by using a laser trimming process in a manner well known in the art to create a void 32 in the resistor 16 which will increase the resistance of the resistor. Preferably, the resistance of each resistor is monitored during the trimming process and the laser trimming operation is controlled using a feedback loop which monitors the resistance as the laser removes material from the body of the resistor.

FIG. 1 illustrates how multiple layers 10 of a multilayer printed circuit board may be joined using intermediate layers 11a and 11b of B-stage thermosetting resin between each layer 10. After bonding the layers together, one or more holes 26 may be drilled through one or more of the layers to make electrical contact between various of the circuits 12 and discrete resistors 16 or other components 28, 30 mounted on the top surface of the multilayer board.

As is evident from the foregoing, various modifications can be made without departing from the spirit of the invention. For example, while substantially square or rectangular resistors have been shown, it should be apparent that the teachings of the invention can be applied to resistive elements of any shape. It is not intended to limit the invention to the details heretofore recited, the invention being defined in the claims which follow.

I claim:
1. A method for producing a multilayer printed circuit board comprising:
  (1) generating a first electrical circuit portion on a first substrate comprising a resin impregnated glass fiber matrix;
  (2) printing a preselected number of resistor elements on said first substrate using a resistive ink comprising a mixture of a resin and carbon particles in a solvent;
  (3) curing the resistive ink to produce a preselected number of resistors having a resistance values;
  (4) generating at least a second electrical circuit on at least one other substrate also comprising a resin impregnated glass fiber matrix;
  (5) repeating steps (2) and (3) for the at least one other substrate; and
  (6) laminating the first and the at least one other substrates to each other to form a multilayer printed circuit board.

2. The method of claim 1 wherein said resistor elements are printed on said substrates by a screening process.

3. The method of claim 2 wherein said electrical circuits on said substrates are copper conductors.

4. The method of claim 3 wherein said copper conductors are screen printed with silver ink in at least those areas on which resistor elements are to be printed.

5. A method for producing a multilayer printed circuit board comprising:

(1) generating a first electrical circuit portion on a first substrate comprising a resin impregnated glass fiber matrix;

(2) printing a preselected number of resistor elements on said first substrate using a resistive ink comprising a mixture of a resin and carbon particles in a solvent;

(3) curing the resistive ink to produce a preselected number of resistors having a resistance value;

(4) comparing the resistance value to a predetermined resistance value;

(5) adjusting the compared resistance value of the resistors to agree with the predetermined value;

(6) generating at least a second electrical circuit on at least one other substrate also comprising a resin impregnated glass fiber matrix;

(7) repeating steps (2) through (5) for the at least one other substrate; and (8) laminating the first and at least one other substrate to each other to form a multilayer printed circuit board.

6. A method for producing a multilayer printed circuit board including at least one intermediate layer, said multilayer printed circuit board having resistors contained on at least one intermediate layer thereof, comprising the steps of:

(1) generating a first electrical circuit on a first substrate comprising a resin impregnated glass fiber matrix, said electrical circuit being generated using a photolithographic process;

(2) screening onto at least one of said intermediate layers of said printed circuit board a preselected number of resistor elements using a resistive ink comprising a mixture of a resin and carbon particles in a solvent;

(3) curing the resistor elements;

(4) generating at least a second electrical circuit on at least a second substrate utilizing the method of step (1) above; and (5) laminating the first and at least second substrates to each other to form a multilayer printed circuit board.

7. The methods of claim 6 wherein said resistor elements are cured by heating the substrate on which said resistor elements are printed.

8. The method of claim 7 wherein said curing is performed in an oven.

9. The method of claim 8 wherein each of said substrates is passed through an oven at a controlled speed to cure said resistive ink.

10. The method of claim 8 wherein said oven has a nitrogen atmosphere to reduce oxidation of the electrical circuit of each of said substrates and thereby reduce long term resistor drift.

11. The method of claim 6 wherein said substrates are fastened to each other using an intermediate B-stage epoxy layer.

12. The method of claim 6 wherein each of said resistor elements are covered with a layer of dielectric material.

13. The method of claim 12 wherein said dielectric material is screened over each of said resistor elements.

14. The method of claim 13 wherein said dielectric material is screened over each of said resistor elements after each of said resistor elements are adjusted to agree with the predetermined resistance value.

15. The method of claim 6 wherein prior to laminating the first and at least second substrates to each other:

(1) the resistance value of each of said resistor elements are compared to a predetermined resistance value; and (2) each of said resistor elements are adjusted to agree with the predetermined resistance value.

16. The method of claim 15 wherein the resistance of each of said resistor elements are adjusted by a laser which removes quantities of said resistive ink from each of said resistor elements.

17. The method of claim 6 wherein said electrical circuits are comprised of copper conductors and each of said resistor elements are in electrical contact with a portion of said copper conductors.

18. The method of claim 17 further including the step of applying a layer of silver conductive ink to each portion of the copper conductors of each electrical circuit which are to contact said resistor elements prior to screening said resistor elements onto said one or more intermediate layers of said printed circuit board.

19. A method for manufacturing a multilayer printed circuit board having two or more layers, each of said layers being comprised of a resin impregnated glass fiber matrix having a top surface and a bottom surface, said layers being bonded together using a thermosetting resin between adjacent ones of said layers, the improvement comprising screening one or more resistors on at least one of said layers prior to another layer being bonded to the top surface of those of said layers having the screened-on resistors.

20. A method for producing a multilayer printed circuit board comprising:

(1) generating a first electrical circuit portion on a first substrate comprising a resin impregnated glass fiber matrix;

(2) printing a preselected number of resistor elements on said first substrate using a resistive ink comprising a mixture of a resin and carbon particles in a solvent;

(3) curing the resistive ink to produce a preselected number of resistors having a resistance value;

(4) comparing the resistance value to a predetermined resistance value;

(5) repeating steps 2 through 4 to obtain other resistors having other resistance values;

(6) adjusting the compared resistance value of the resistors to agree with the predetermined values;

(7) generating at least a second electrical circuit on one or more other substrate also comprising a resin impregnated glass fiber matrix;

(8) repeating steps 2 through 6 for at least one of said other substrates; and (9) laminating the first and at least one other of said substrates to each other to form a multilayer printed circuit board.

* * * * *